(12) United States Patent
Li et al.

(10) Patent No.: US 11,080,445 B2
(45) Date of Patent: Aug. 3, 2021

(54) METHOD AND DEVICE FOR PREDICTING OPERATION PARAMETER OF INTEGRATED CIRCUIT

(71) Applicant: Shanghai Zhaoxin Semiconductor Co., Ltd., Shanghai (CN)

(72) Inventors: Yi Li, Shanghai (CN); Xiaojing Li, Shanghai (CN); Miao Liu, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/742,160

(22) Filed: Jan. 14, 2020

(65) Prior Publication Data

US 2021/0096171 A1 Apr. 1, 2021

(30) Foreign Application Priority Data

Sep. 27, 2019 (CN) .......................... 201910921170.6

(51) Int. Cl.
*G06F 30/3312* (2020.01)
*G06F 30/367* (2020.01)
*G01R 31/28* (2006.01)
*G01R 31/30* (2006.01)

(52) U.S. Cl.
CPC ..... *G06F 30/3312* (2020.01); *G01R 31/2882* (2013.01); *G01R 31/30* (2013.01); *G06F 30/367* (2020.01)

(58) Field of Classification Search
CPC .................................................. G06F 30/3312
USPC ........................................................ 716/113
See application file for complete search history.

(56) References Cited

U.S. PATENT DOCUMENTS

2016/0357894 A1* 12/2016 Frederick, Jr. ...... G06F 30/3312

* cited by examiner

*Primary Examiner* — Eric D Lee
(74) *Attorney, Agent, or Firm* — McClure, Qualey & Rodack, LLP

(57) ABSTRACT

A method for predicting an operation parameter of an integrated circuit includes the following steps. A plurality of cells used by the integrated circuit are provided. A voltage-frequency sweep test is performed on each of cells through a test model to generate a plurality of parameters, wherein the parameters correspond to a voltage value. A lookup table is established according to the parameters. A timing signoff corresponding to the integrated circuit is obtained. A timing analysis is performed on a plurality of timing paths of the integrated circuit according to the timing signoff and the parameters of the lookup table to obtain a critical timing path, and the operation parameter of the integrated circuit is predicted according to the critical timing path.

11 Claims, 6 Drawing Sheets

METHOD AND DEVICE FOR PREDICTING OPERATION PARAMETER OF INTEGRATED CIRCUIT

CROSS REFERENCE TO RELATED APPLICATIONS

This application claims priority of China Patent Application No. 201910921170.6, filed on Sep. 27, 2019, the entirety of which is incorporated by reference herein.

BACKGROUND OF THE INVENTION

Field of the Invention

The present invention relates to a method and a device for predicting, and in particular, it relates to a method and a device for predicting an operation parameter of an integrated circuit.

Description of the Related Art

In general, the highest working frequency of a central processing unit (CPU) is one of the most important indicators of a processor. The highest working frequency of a processor is associated with the working mode (such as a single core or multiple cores), the working voltage, the working time, etc. of the processor.

However, in order to obtain the highest working frequency of a processor, the processor usually has to have completed the product development stage and the package must have been completed. Correlation detection is performed on the processor to obtain the highest working frequency, so as to determine whether the processor may achieve the requirement of the develop specification. Accordingly, the cost of using the circuit may be increased. If the highest working frequency of the processor may be obtained at the product design stage, the convenience and the flexibility of a design of an integrated circuit may be increased. Therefore, how to predict the operation parameter of the integrated circuit quickly and accurately has become a focus for technical improvements by various manufacturers.

BRIEF SUMMARY OF THE INVENTION

The present invention provides a method and a device for predicting an operation parameter of an integrated circuit, thereby quickly and accurately predicting the operation parameter of the integrated circuit, and increasing the convenience and flexibility of a design of the integrated circuit.

The present invention provides a method for predicting an operation parameter of an integrated circuit, which includes the following steps. A plurality of cells used by the integrated circuit are provided. A voltage-frequency sweep test is performed on each of the cells through a test model to generate a plurality of parameters, wherein the parameters correspond to a voltage value. A lookup table is established according to the parameters. A timing signoff corresponding to the integrated circuit is obtained. A timing analysis is performed on a plurality of timing paths of the integrated circuit according to the timing signoff and the parameters of the lookup table to obtain a critical timing path, and the operation parameter of the integrated circuit is predicted according to the critical timing path.

In addition, the present invention provides device for predicting an operation parameter of an integrated circuit, which includes a providing device, a testing device and a processing device. The providing device is configured to provide a plurality of cells used by the integrated circuit. The testing device is coupled to the providing device. The testing device is configured to obtain the cells, and perform a voltage-frequency sweep test on each of the cells through a test model to generate a plurality of parameters, wherein the parameters correspond to a voltage value. The processing device is coupled to the testing device. The processing device is configured to obtain the parameters, establish a lookup table according to the parameters, obtain a timing signoff corresponding to the integrated circuit, perform a timing analysis on a plurality of timing paths of the integrated circuit according to the timing signoff and the parameters of the lookup table to obtain a critical timing path, and predict the operation parameter of the integrated circuit according to the critical timing path.

According to the method and the device for predicting the operation parameter of the integrated circuit of the present invention, the plurality of cells used by the integrated circuit are provided. The voltage-frequency sweep test is performed on each cell through the test model to generate the plurality of parameters and the lookup table is established. Then, the timing analysis is performed on the plurality of timing paths of the integrated circuit according to the timing signoff and the parameters of the lookup table to obtain the critical timing path, and the operation parameter of the integrated circuit is predicted according to the critical timing path. Therefore, the operation parameter of the integrated circuit may be predicted quickly and accurately, and the convenience and flexibility of the design of the integrated circuit may also be increased.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In each of the following embodiments, the same reference number represents an element or component that is the same or similar.

Figure 1:
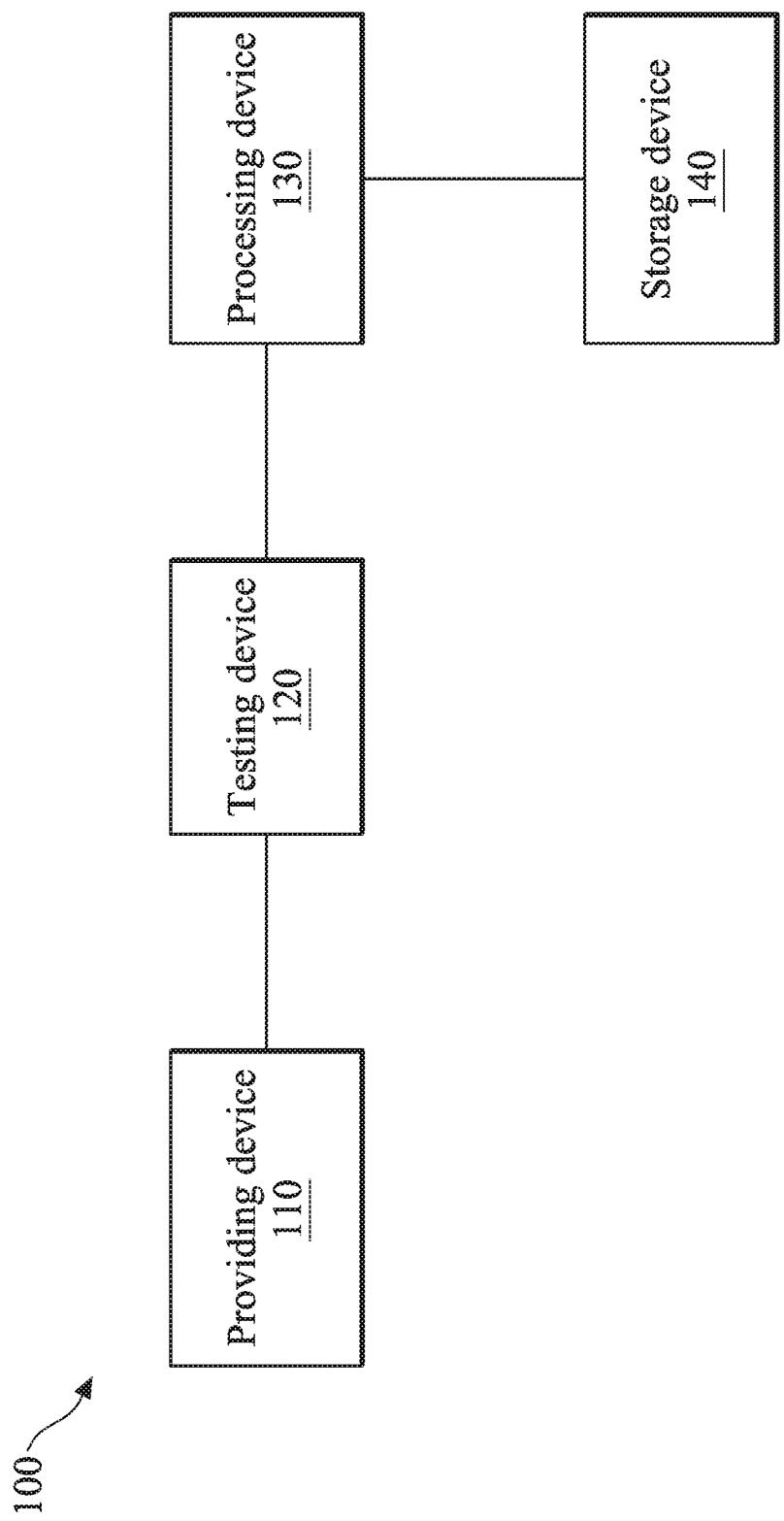
FIG. 1 shows a schematic view of a device for predicting an operation parameter of an integrated circuit according to an embodiment of the present invention.

FIG. 1 shows a schematic view of a device for predicting an operation parameter of an integrated circuit according to an embodiment of the present invention. Please refer to FIG. 1. The device for predicting the operation parameter of the integrated circuit 100 includes a providing device 110, a testing device 120 and a processing device 130. In the embodiment, the device for predicting the operation parameter of the integrated circuit 100 may be a computing device, such as a notebook computer, a desktop computer, etc. In addition, the device for predicting the operation parameter of the integrated circuit 100 is suitable to predict operation parameters of a design of the integrated circuit. That is, the operating parameters of the integrated circuit that is in the product development stage and has not been packaged are predicted, so as to adjust the product specifications and the optimization strategy.

The providing device 110 is configured to provide a plurality of cells used by the integrated circuit. In the embodiment, the integrated circuit is, for example, a central processing unit (CPU). The above cells may be logic elements or logic components, such as, but not limited to, AND gates, buffers, etc. Furthermore, the above cells may be all of the cells used by a plurality of timing paths of the integrated circuit, or the cells used by a critical path of the integrated circuit.

For example, the providing device 110 may be executed by the processing device and be shown on a display through a user interface. The user may perform a select operation through the user interface displayed on the display. That is, the user may select all of the cells used by the integrated circuit or the cells used by the critical timing path of the integrated circuit. Accordingly, the providing device 110 may provide the cells used by the integrated circuit.

The testing device 120 is coupled to the providing device 110. The testing device 120 is configured to obtain the cells provided by the providing device 110. In addition, the testing device 120 may perform a voltage-frequency sweep test on each of the cells through a test model 200 (as shown in FIG. 2) separately to generate a plurality of parameters, wherein the parameters correspond to a voltage value.

Figure 2:
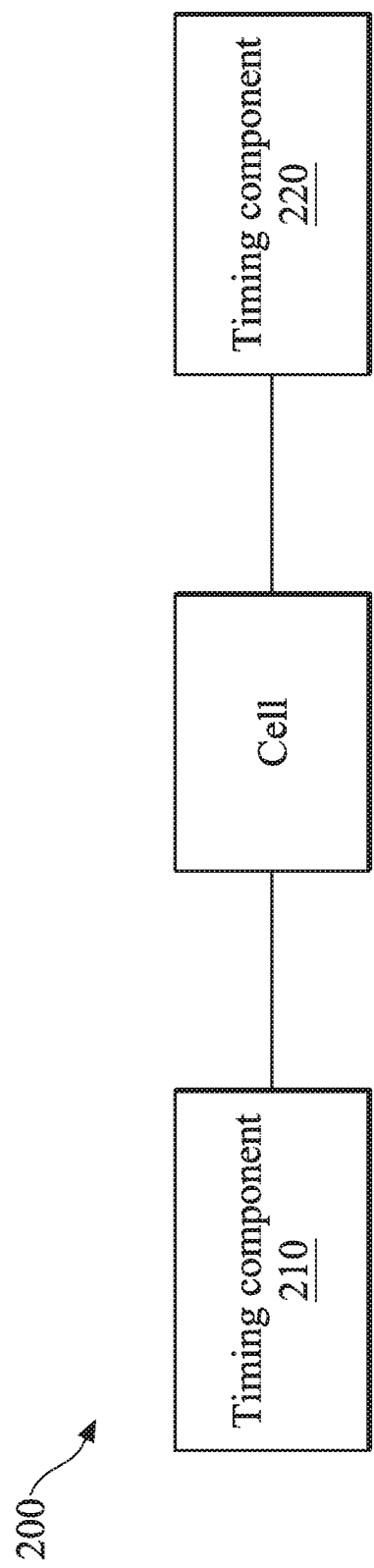
FIG. 2 shows a schematic view of a test model according to an embodiment of the present invention.

In the embodiment, the test model 200 may include two timing components 210 and 220, as shown in FIG. 2. In addition, the timing components 210 and 220 may be logic elements or logic components, such as flip-flops (FFs). Furthermore, the testing device 120 may configure each of cells provided by the providing device 110 to couple between the timing components 210 and 220.

Then, the testing device 120 may use the test model 200 as shown in FIG. 2 to perform a voltage-frequency sweep test on each of the cells provided by the providing device 110 in order, so as to obtain an operation time of each of the cells. The operation time is a time from an output terminal of the timing component 210 generating an output signal to an input terminal of the timing component 220 receiving an input signal. Afterward, the testing device 120 normalizes the operation time of each of the cells to generate a parameter corresponding to each of the cells, such as a normalized delay factor. In the embodiment, the normalized delay factor is associated, for example, with a voltage and a frequency.

For example, the testing device 120 may simulate through an interpolation method or a simulation tool (such as xTime), and use a designation voltage to perform a voltage-frequency sweep test on each of the cells of the test model 200, so as to generate a plurality of parameters corresponding to each of the cells. In the embodiment, the above parameters corresponding to the voltage value of the designation voltage. In addition, the above parameters may change with the magnitude of the designation voltage. For example, when the voltage value of the designation value is greater than 1V, the value of the above parameter may be less than 1, and this indicates that the operation speed of the above cell is quick. When the voltage value of the designation voltage is less than 1V, the value of the above parameter may be greater than 1, and this indicates that the operation speed of the above cell is slow. In addition, when the voltage value of the designation voltage is 1V, the value of the above parameter may be equal to 1.

In the embodiment, a voltage value of the designation voltage is, for example, 1.3V, but the embodiment of the present invention is not limited thereto. The user may adjust the designation voltage according to the requirements thereof. The voltage value of the designation voltage may be, for example, 0.95V, 1.05V, 1.1V, 1.15V, 1.2V, 1.25V etc. The above voltage values belong the protection scope of the present invention.

The processing device 130 is coupled to the testing device 120. The processing device 130 obtains the parameters generated by the testing device 120, and establishes a lookup table according to the obtained parameters. That is, the processing device 130 obtains the above parameters and the corresponding designation voltage, and establishes the lookup table having the above parameters associated with the designation voltage according to a corresponding relationship of the above parameters and the corresponding designation voltage, as shown in Table 1. In Table 1, the parameter corresponding to a cell 1 under the designation voltage of 1.3V is 0.843, the parameter corresponding to a cell 2 under the designation voltage of 1.3V is 0.897, the parameter corresponding to a cell 3 under the designation voltage of 1.3V is 0.842, . . . , the parameter corresponding to a cell N under the designation voltage of 1.3V is 0.786, wherein N is a positive integer.

TABLE 1

| cell name | designation voltage | |
|---|---|---|
| | 1 V | 1.3 V |
| cell 1 | 1 | 0.843 |
| cell 2 | 1 | 0.897 |
| cell 3 | 1 | 0.842 |
| . | . | . |
| . | . | . |
| . | . | . |
| cell N | 1 | 0.786 |

Then, the processing device 130 obtains a timing signoff corresponding to the integrated circuit. In the embodiment, the timing signoff corresponding to the integrated circuit is, for example, a result that the timing analysis is performed on all timing paths of the integrated circuit by using a voltage of 1V, and the timing signoff serves as a basis for the subsequent analysis. Afterward, the processing device 130 may perform a timing analysis on a plurality of timing paths of the integrated circuit according to the timing signoff and the parameters of the lookup table to obtain a critical timing path, and predict the operation parameter of the integrated circuit according to the critical timing path.

Figure 3:
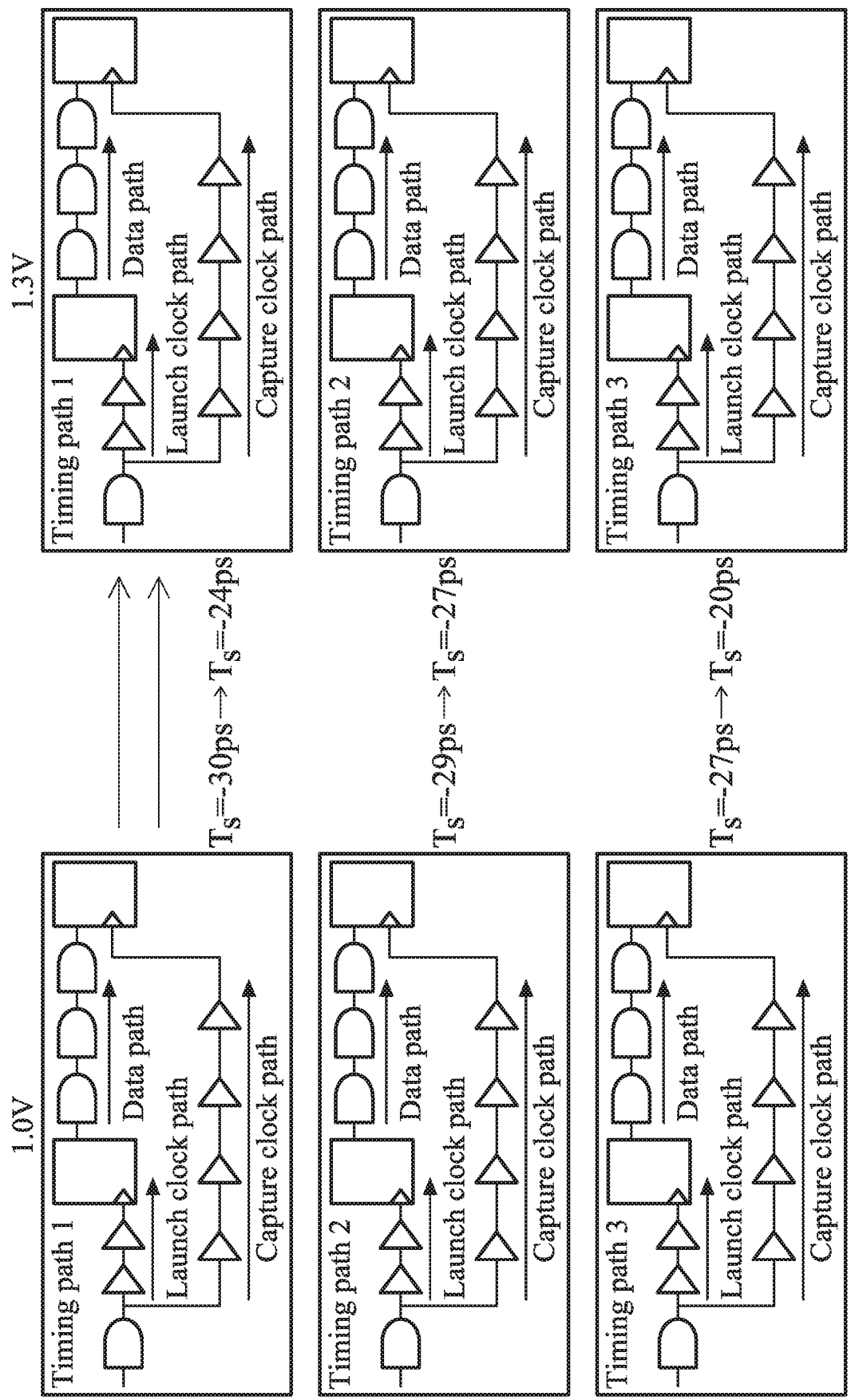
FIG. 3 shows a schematic view of a plurality of timing paths of an integrated circuit according to an embodiment of the present invention.

For example, when the processing device 130 obtains the timing signoff corresponding to the integrated circuit, the processing device 130 may further obtain the result that the timing analysis is performed on all timing paths of the integrated circuit, such as the result of timing analysis of a timing path 1, a timing path 2 and a timing path corresponding to a voltage of 1V as shown in FIG. 3. In FIG. 3, a slack time $T_S$ of the timing path 1 corresponding to the voltage of 1V is −30 ps, a slack time $T_S$ of the timing path 2 corresponding to the voltage of 1V is −29 ps, and a slack time $T_S$ of the timing path 3 corresponding to the voltage of 1V is −27 ps. In the embodiment, the slack time may be calculated according to the following formula (1):

$$T_S = T_P + D_C - (D_L + D_D) - C_U - T,\quad (1)$$

wherein $T_S$ is the slack time, $T_P$ is a time of one run cycle, $D_C$ is the delay time of a capture clock path, $D_L$ is a delay time of a launch clock path, $D_D$ is the delay time of a data path, $C_U$ is a clock uncertain time and T is a predetermined time. In addition, when the slack time $T_S$ is larger, this indicates that the operation frequency corresponding to the timing path is slower.

Then, the processing device 130 may search the parameters of the cells of the timing path 1, the timing path 2 and timing path 3 corresponding to the designation voltage of 1.3V in the lookup table, wherein the timing path 1, the timing path 2 and timing path 3 correspond to 1V. After the processing device 130 obtains the parameters of the cells corresponding to the designation voltage of 1.3V, the processing device 130 may multiply the delay time of each of the cells by the corresponding parameter. Then, the processing device 130 performs the timing analysis on the timing path 1, the timing path 2 and timing path 3 corresponding to the designation voltage of 1.3V to obtain the slack times of the timing path 1, the timing path 2 and the timing path 3 corresponding to the designation voltage of 1.3V.

As shown in FIG. 3, the slack time $T_S$ of the timing path 1 corresponding to the designation voltage of 1.3V is −24 ps, the slack time $T_S$ of the timing path 2 corresponding to the designation voltage of 1.3V is −27 ps, and the slack time $T_S$ of the timing path 3 corresponding to the designation voltage of 1.3V is −20 ps. Afterward, the processing device 130 may order the magnitudes of the slack times of the timing path 1, the timing path 2 and timing path 3 corresponding to the designation voltage of 1.3V, and select the timing path that the slack time is largest among the timing paths corresponding to the designation voltage 1.3 as the critical timing path. At this time, the critical timing path is the timing path 2 corresponding to the designation voltage 1.3V.

Then, the processing device 130 predicts the operation parameter of the integrated circuit corresponding to the designation voltage of 1.3V according to the slack time of the critical timing path. That is, the frequency run by the critical timing path may serve as the highest working frequency run by the integrated circuit under the designation voltage of 1.3V. Therefore, the user may know the corresponding relationship of the highest working frequency of the integrated circuit and the corresponding designation voltage as soon as possible, so as to formulate the specifications for adjusting the product design and further adjust the optimization strategy, thereby increasing the convenience of the design of the integrated circuit.

In the above embodiments, the timing paths of the integrated circuit are, for example, three (such as the timing path 1, the timing path 2 and the timing path 3), and the example of the cells configured in the timing paths and the connection relationship thereof is only one exemplary embodiment of the embodiments of the present invention. However, the embodiment of the present invention is not limited thereto. The user may adjust the number of timing paths, the number of cells configured in the timing path and the connection relationship thereof according to the requirements thereof. The adjusted embodiment is the same as the description of the above embodiment, it may achieve the same effect, and the description thereof is not repeated herein.

In addition, in above embodiment, the testing deice 120 uses one designated voltage (such as 1.3 V) to perform the voltage-frequency sweep test on each of the cells used by the integrated circuit through the test model 200 as shown in FIG. 2, so as to generate the parameters corresponding to the cells under the designated voltage of 1.3 V, but the present invention is not limited thereto. The testing device 120 may also use different designation voltages, such as 0.95V, 1.05V, 1.1V, 1.15V, 1.2V, 1.25V, 1.3V, etc.

Then, the testing device 120 uses above different voltages listed above (such as 0.95V, 1.05V, 1.1V, 1.15V, 1.2V, 1.25V and 1.3V) to perform the voltage-frequency sweep test on each of the cells used by the integrated circuit through the test model 200 as shown in FIG. 2, so as to generate the parameters corresponding to the above cells under the different designated voltages. That is, the testing device 120 may generate the parameters corresponding to the above cell under the designated voltage of 0.95V, the parameters corresponding to the above cell under the designated voltage of 1.05V, the parameters corresponding to the above cell under the designated voltage of 1.1V, the parameters corresponding to the above cell under the designated voltage of 1.15V, the parameters corresponding to the above cell under the designated voltage of 1.2V, the parameters corresponding to the above cell under the designated voltage of 1.25V, and the parameters corresponding to the above cell under the designated voltage of 1.3V.

The processing device 130 obtains the parameters generated by the testing device 120, and establishes a lookup table according to the obtained parameters. That is, the processing device 130 obtains the above parameters and the corresponding designation voltages, and establishes the lookup table having the above parameters associated with the designation voltages according to a corresponding relationship of the above parameters and the corresponding designation voltages, as shown in Table 2.

TABLE 2

| cell name | designation voltage | | | | | | | |
|---|---|---|---|---|---|---|---|---|
| | 0.95 V | 1 V | 1.05 V | 1.1 V | 1.15 V | 1.2 V | 1.25 V | 1.3 V |
| cell 1 | 1.121 | 1 | 0.973 | 0.947 | 0.921 | 0.895 | 0.869 | 0.843 |
| cell 2 | 1.087 | 1 | 0.982 | 0.965 | 0.948 | 0.931 | 0.914 | 0.897 |
| cell 3 | 1.122 | 1 | 0.973 | 0.947 | 0.921 | 0.895 | 0.869 | 0.842 |
| . | . | . | . | . | . | . | . | . |
| . | . | . | . | . | . | . | . | . |
| cell N | 1.101 | 1 | 0.975 | 0.95 | 0.926 | 0.901 | 0.846 | 0.786 |

Then, after the processing device 130 obtains the timing signoff corresponding to the integrated circuit, the processing device 130 may search the parameters of the cells used by the timing circuit corresponding to the timing signoff under the above different voltages listed above (such as 0.95V, 1.05V, 1.1V, 1.15V, 1.2V, 1.25V and 1.3V).

After the processing device 130 obtains the parameters of the cells corresponding to the different designation voltages (such as 0.95V, 1.05V, 1.1V, 1.15V, 1.2V, 1.25V and 1.3V), the processing device 130 may multiply the delay time of each of the cells by the corresponding parameter. Then, the processing device 130 may perform the timing analysis on the timing paths corresponding to the different designation voltages (such as 0.95V, 1.05V, 1.1V, 1.15V, 1.2V, 1.25V and 1.3V) to obtain the slack times corresponding to the different designation voltages (such as 0.95V, 1.05V, 1.1V, 1.15V, 1.2V, 1.25V and 1.3V)

Afterward, the processing device 130 may order the magnitudes of the slack times of the timing paths corresponding to the different designation voltages (such as 0.95V, 1.05V, 1.1V, 1.15V, 1.2V, 1.25V and 1.3V), and select the timing paths that the slack time is largest among the timing paths corresponding to the different designation voltages (such as 0.95V, 1.05V, 1.1V, 1.15V, 1.2V, 1.25V and 1.3V) as the critical timing paths. The manner of selecting the critical timing paths corresponding to the different designation voltages is the same as the description of the embodiment in FIG. 3, and the description thereof is not repeated herein.

Then, the processing device 130 predicts the operation parameters of the integrated circuit corresponding to the different designation voltages (such as 0.95V, 1.05V, 1.1V, 1.15V, 1.2V, 1.25V and 1.3V) according to the slack times of the selected critical timing paths. That is, the frequencies run by the critical timing paths may serve as the highest working frequencies run by the integrated circuit under the designation voltages (such as 0.95V, 1.05V, 1.1V, 1.15V, 1.2V, 1.25V and 1.3V). Therefore, the user may know the corresponding relationship between the highest working frequencies of the integrated circuit and the corresponding designation voltages (such as 0.95V, 1.05V, 1.1V, 1.15V, 1.2V, 1.25V and 1.3V) as soon as possible, so as to formulate the specifications for adjusting the product design and further adjust the optimization strategy, thereby increasing the convenience of the design of the integrated circuit.

In addition, the embodiment does not need to generate, for example, a lot of data of a standard unit of a process-voltage-time test (PVT) and a corresponding timing library, so as to increase the speed and convenience of prediction and decrease the complexity of the design. Furthermore, the operation parameters of the integrated circuit may be predicted by using all of the cells used by the timing paths of the integrated circuit or the cells used by the critical timing path(s) of the integrated circuit, thereby increasing the flexibility and accuracy of prediction.

Furthermore, the device for predicting the operation parameter of the integrated circuit 100 further includes a storage device 140. The storage device 140 is coupled to the processing device 130 and configured to store the lookup table. In the embodiment, the storage device 140 is, for example, a volatile memory, a non-volatile memory, a hard disk, a solid-state disk, etc.

Figure 4:
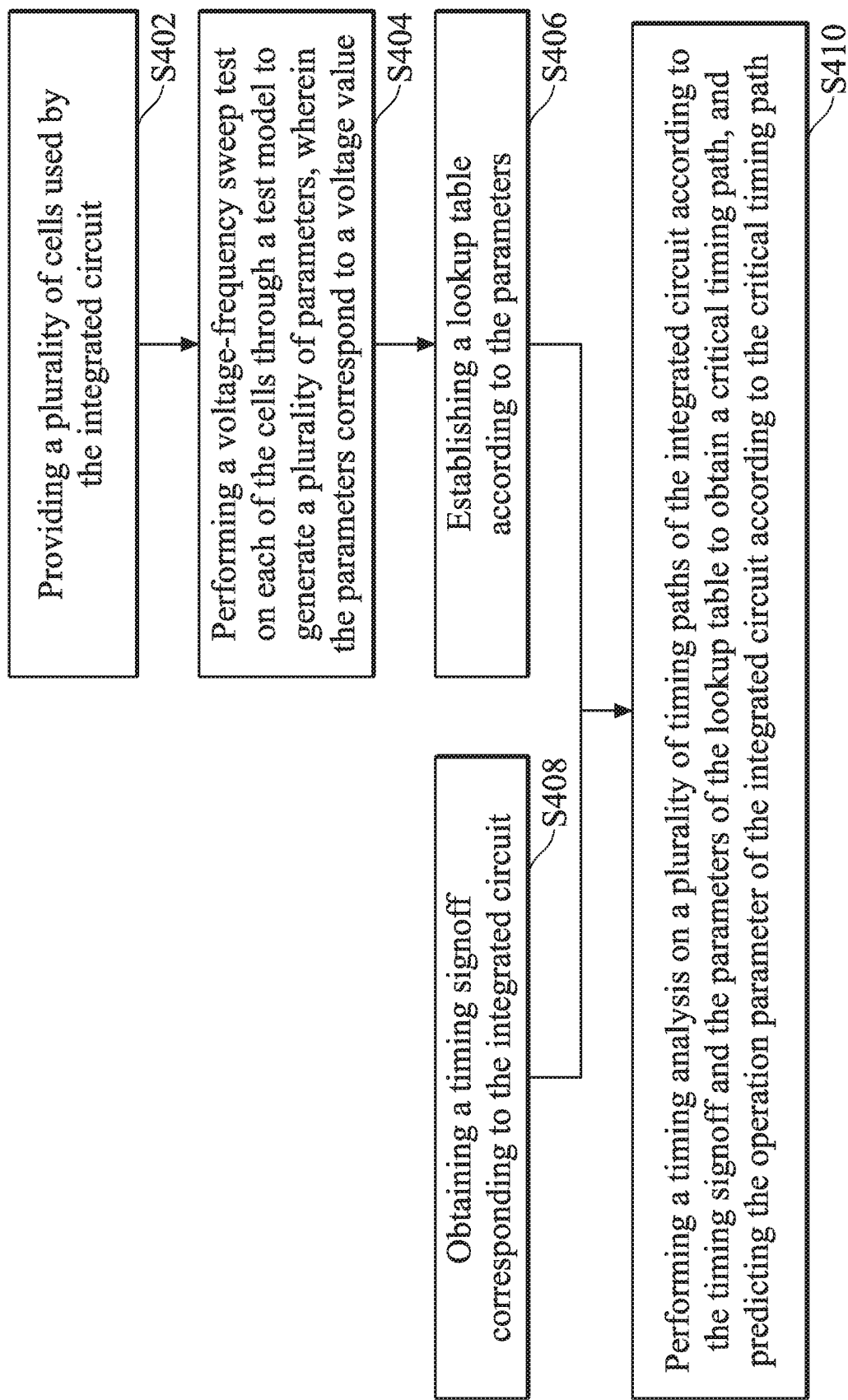
FIG. 4 shows a flowchart of a method for predicting an operation parameter of an integrated circuit according to an embodiment of the present invention.

According to the description of the above embodiments, the present invention further provides a method for predicting an operation parameter of an integrated circuit. FIG. 4 shows a flowchart of a method for predicting an operation parameter of an integrated circuit according to an embodiment of the present invention. In step S402, the method involves providing a plurality of cells used by the integrated circuit. In step S404, the method involves performing a voltage-frequency sweep test on each of the cells through a test model to generate a plurality of parameters, wherein the parameters correspond to a voltage value.

In step S406, the method involves establishing a lookup table according to the parameters. In step S408, the method involves obtaining a timing signoff corresponding to the integrated circuit. In step S410, the method involves performing a timing analysis on a plurality of timing paths of the integrated circuit according to the timing signoff and the parameters of the lookup table to obtain a critical timing path, and predicting the operation parameter of the integrated circuit according to the critical timing path. In the embodiment, the test model includes two timing components, and each of the cells is coupled between the two timing components. In addition, the cells are all of the cells used by the timing paths of the integrated circuit, or cells used by the critical timing path of the integrated circuit.

Figure 5:
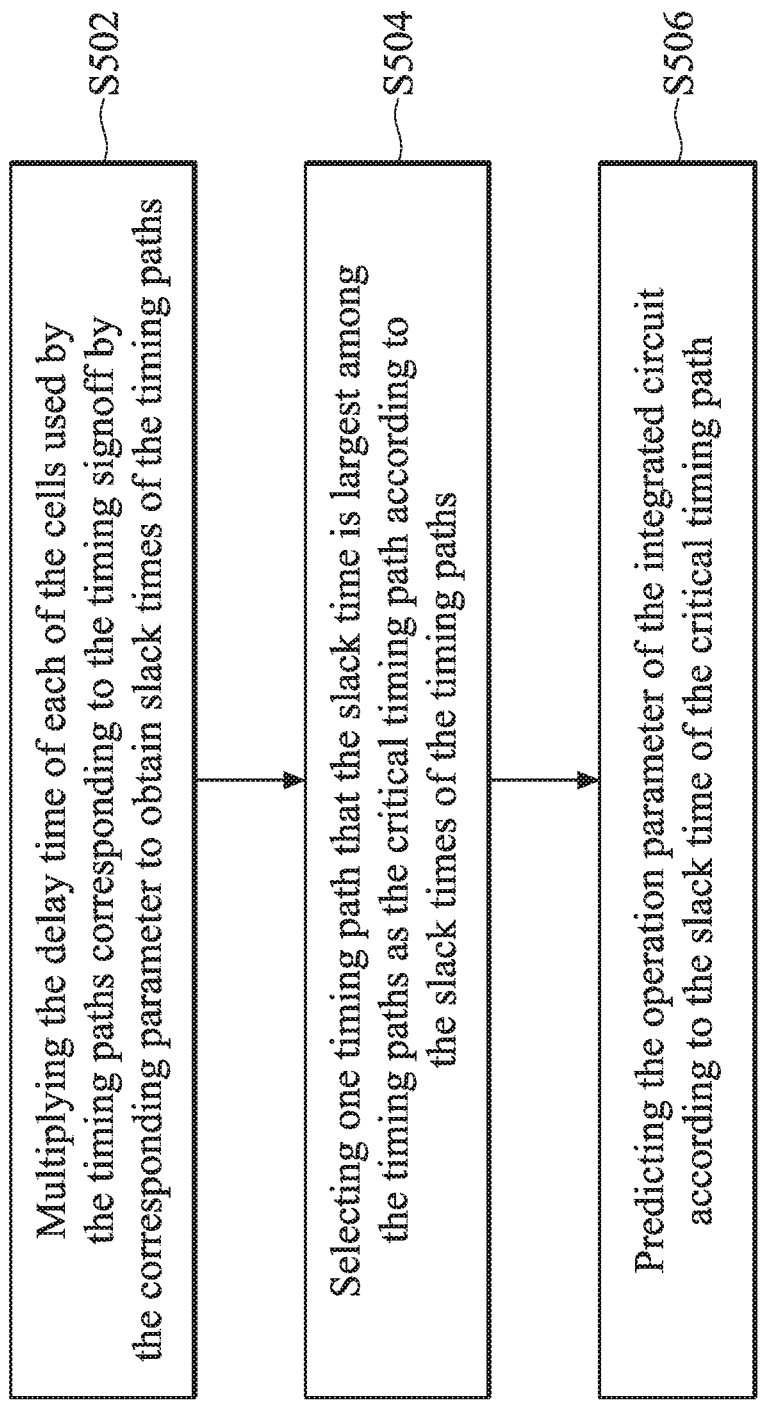
FIG. 5 shows a detailed flowchart of step S410 in FIG. 4.

FIG. 5 shows a detailed flowchart of step S410 in FIG. 4. In step S502, the method involves multiplying the delay time of each of the cells used by the timing paths corresponding to the timing signoff by the corresponding parameter to obtain slack times of the timing paths. In step S504, the method involves selecting one timing path that the slack time is largest among the timing paths as the critical timing path according to the slack times of the timing paths. In step S506, the method involves predicting the operation parameter of the integrated circuit according to the slack time of the critical timing path.

Figure 6:
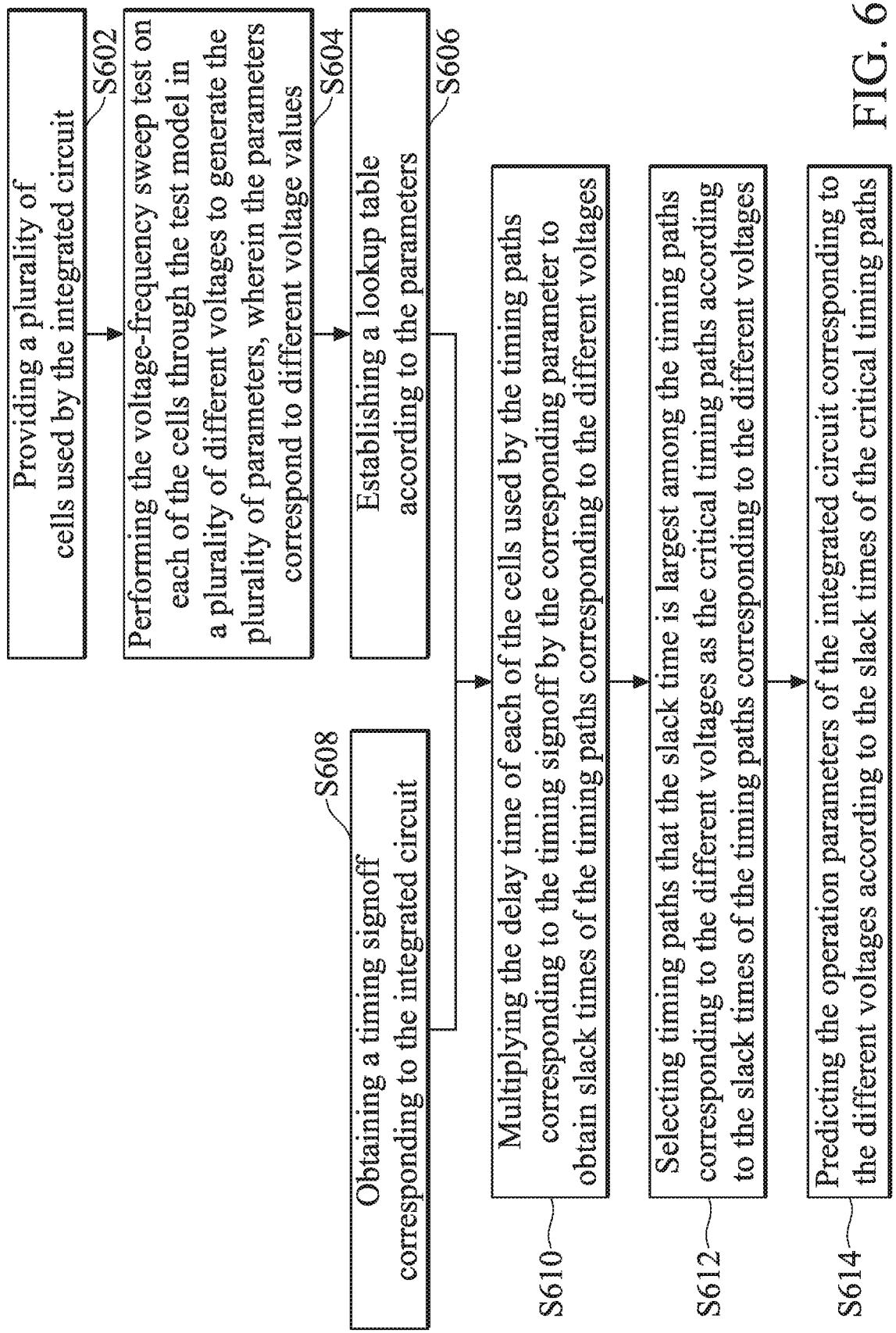
FIG. 6 shows a flowchart of a method for predicting an operation parameter of an integrated circuit according to another embodiment of the present invention.

FIG. 6 shows a flowchart of a method for predicting an operation parameter of an integrated circuit according to another embodiment of the present invention. In step S602, the method involves providing a plurality of cells used by the integrated circuit. In step S604, the method involves performing the voltage-frequency sweep test on each of the cells through the test model in a plurality of different voltages to generate the plurality of parameters, wherein the parameters correspond to different voltage values.

In step S606, the method involves establishing a lookup table according to the parameters. In step S608, the method involves obtaining a timing signoff corresponding to the integrated circuit. In step S610, the method involves multiplying the delay time of each of the cells used by the timing paths corresponding to the timing signoff by the corresponding parameter to obtain slack times of the timing paths corresponding to the different voltages. In step S612, the method involves selecting timing paths that the slack time is largest among the timing paths corresponding to the different voltages as the critical timing paths according to the slack times of the timing paths corresponding to the different voltages.

In step S614, the method involves predicting the operation parameters of the integrated circuit corresponding to the different voltages according to the slack times of the critical timing paths. In the embodiment, the test model includes two timing components, and each of the cells is coupled between the two timing components. In addition, the cells are all of the cells used by the timing paths of the integrated circuit, or cells used by the critical timing path of the integrated circuit.

In summary, according to the method and the device for predicting the operation parameter of the integrated circuit of the present invention, the plurality of cells used by the integrated circuit (such as all of cells or some of cells used by the integrated circuit) are provided. The voltage-frequency sweep test is performed on each cell through the test model to generate the plurality of parameters and the lookup table is established. Then, the timing analysis is performed on the plurality of timing paths of the integrated circuit according to the timing signoff and the parameters of the lookup table to obtain the critical timing path, and the operation parameter of the integrated circuit is predicted according to the critical timing path. Therefore, the operation parameter of the integrated circuit may be predicted quickly and accurately, and the convenience and flexibility of the design of the integrated circuit may also be increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for predicting an operation parameter of an integrated circuit, comprising:
   providing a plurality of cells used by the integrated circuit;
   providing a test model comprising a first timing component and a second timing component, and configuring each of the cells to couple between the first timing component and the second timing component;
   performing a voltage-frequency sweep test on each of the cells through the test model to obtain an operation time of each of the cells, and normalizing the operation time of each of the cells to generate a plurality of parameters, wherein the parameters correspond to a voltage value and the operation time is a time from an output terminal of the first timing component generating an output signal to an input terminal of the second timing component receiving an input signal;
   establishing a lookup table according to the parameters;
   obtaining a timing signoff corresponding to the integrated circuit; and
   performing a timing analysis on a plurality of timing paths of the integrated circuit according to the timing signoff and the parameters of the lookup table to obtain a critical timing path, and predicting the operation parameter of the integrated circuit according to the critical timing path.

2. The method for predicting the operation parameter of the integrated circuit as claimed in claim 1, wherein the step of performing the voltage-frequency sweep test on each of the cells through the test model to obtain the operation time of each of the cells, and normalizing the operation time of each of the cells to generate the plurality of parameters comprises:
   performing the voltage-frequency sweep test on each of the cells through the test model in a plurality of different voltages to obtain the operation times of each of the cells, and normalizing the operation times of each of the cells to generate the plurality of parameters, wherein the parameters correspond to different voltage values.

3. The method for predicting the operation parameter of the integrated circuit as claimed in claim 2, wherein the step of performing the timing analysis on the plurality of timing paths of the integrated circuit according to the timing signoff and the parameters of the lookup table to obtain the critical timing path, and predicting the operation parameter of the integrated circuit according to the critical timing path comprises:
   multiplying a delay time of each of the cells used by the timing paths corresponding to the timing signoff by the corresponding parameter to obtain slack times of the timing paths corresponding to the different voltages;
   selecting timing paths that the slack time is largest among the timing paths corresponding to the different voltages as the critical timing paths according to the slack times of the timing paths corresponding to the different voltages; and
   predicting the operation parameters of the integrated circuit corresponding to the different voltages according to the slack times of the critical timing paths.

4. The method for predicting the operation parameter of the integrated circuit as claimed in claim 1, wherein the step of performing the timing analysis on the plurality of timing paths of the integrated circuit according to the timing signoff and the parameters of the lookup table to obtain the critical timing path, and predicting the operation parameter of the integrated circuit according to the critical timing path comprises:
   multiplying a delay time of each of the cells used by the timing paths corresponding to the timing signoff by the corresponding parameter to obtain slack times of the timing paths;
   selecting one timing path that the slack time is largest among the timing paths as the critical timing path according to the slack times of the timing paths; and
   predicting the operation parameter of the integrated circuit according to the slack time of the critical timing path.

5. The method for predicting the operation parameter of the integrated circuit as claimed in claim 1, wherein the cells are all of the cells used by the timing paths of the integrated circuit, or cells used by the critical timing path of the integrated circuit.

6. A device for predicting an operation parameter of an integrated circuit, comprising:
   a providing device, configured to provide a plurality of cells used by the integrated circuit;
   a testing device, coupled to the providing device, and configured to obtain the cells, provide a test model comprising a first timing component and a second timing component and configure each of the cells to couple between the first timing component and the second timing component, and perform a voltage-frequency sweep test on each of the cells through the test model to obtain an operation time of each of the cells and normalize the operation time of each of the cells to generate a plurality of parameters, wherein the parameters correspond to a voltage value and the operation time is a time from an output terminal of the first timing component generating an output signal to an input terminal of the second timing component receiving an input signal;
   a processing device, coupled to the testing device, and configured to obtain the parameters, establish a lookup table according to the parameters, obtain a timing signoff corresponding to the integrated circuit, perform a timing analysis on a plurality of timing paths of the integrated circuit according to the timing signoff and the parameters of the lookup table to obtain a critical timing path, and predict the operation parameter of the integrated circuit according to the critical timing path.

7. The device for predicting the operation parameter of the integrated circuit as claimed in claim 6, further comprising a storage unit, configured to store the lookup table.

8. The device for predicting the operation parameter of the integrated circuit as claimed in claim 6, wherein the testing device performs the voltage-frequency sweep test on each of the cells through the test model in a plurality of different voltages to obtain the operation times of each of the cells, and normalizes the operation times of each of the cells to generate the plurality of parameters, wherein the parameters correspond to different voltage values.

9. The device for predicting the operation parameter of the integrated circuit as claimed in claim 8, wherein the processing device multiplies a delay time of each of the cells used by the timing paths corresponding to the timing signoff by the corresponding parameter to obtain slack times of the timing paths corresponding to the different voltages, the processing device selects timing paths that the slack time is largest among the timing paths corresponding to the different voltages as the critical timing paths according to the slack times of the timing paths corresponding to the different voltages, and the processing device predicts the operation parameters of the integrated circuit corresponding to the different voltages according to the slack times of the critical timing paths.

10. The device for predicting the operation parameter of the integrated circuit as claimed in claim 6, wherein the processing device multiplies a delay time of each of the cells used by the timing paths corresponding to the timing signoff by the corresponding parameter to obtain slack times of the timing paths, selects one timing path that the slack time is largest among the timing paths as the critical timing path according to the slack times of the timing paths, and predicts the operation parameter of the integrated circuit according to the slack time of the critical timing path.

11. The device for predicting the operation parameter of the integrated circuit as claimed in claim 6, wherein the cells are all of the cells used by the timing paths of the integrated circuit, or cells used by the critical timing path of the integrated circuit.

\* \* \* \* \*